United States Patent [19]
Lehne et al.

[11] Patent Number: 5,235,283
[45] Date of Patent: Aug. 10, 1993

[54] GRADIENT COIL SYSTEM FOR A NUCLEAR MAGNETIC RESONANCE TOMOGRAPHY APPARATUS WHICH REDUCES ACOUSTIC NOISE

[75] Inventors: Dietmar Lehne, Poxdorf; Guenter Theil, Erlangen; Guenther Pausch, Effeltrich; Wolfgang Rogler, Moehrendorf, all of Fed. Rep. of Germany

[73] Assignee: Siemens Aktiengesellschaft, Munich, Fed. Rep. of Germany

[21] Appl. No.: 829,384

[22] Filed: Feb. 3, 1992

[30] Foreign Application Priority Data

Feb. 7, 1991 [DE] Fed. Rep. of Germany ....... 4103751
Dec. 16, 1991 [DE] Fed. Rep. of Germany ....... 4141514

[51] Int. Cl.$^5$ ............................................. G01R 33/20
[52] U.S. Cl. ................... 324/318; 324/322; 128/653.5
[58] Field of Search ................ 335/219; 324/300, 307, 324/309, 318, 319, 320, 322; 128/653.2, 653.5

[56] References Cited

U.S. PATENT DOCUMENTS

| | | | |
|---|---|---|---|
| 4,486,711 | 12/1984 | Frese et al. | 324/319 |
| 4,595,899 | 6/1986 | Smith et al. | 324/320 |
| 4,902,995 | 2/1990 | Vermilyea | 335/216 |
| 4,924,198 | 5/1990 | Laskaris | 335/216 |

FOREIGN PATENT DOCUMENTS

| | | |
|---|---|---|
| 0123075 | 3/1984 | European Pat. Off. . |
| 0132685 | 2/1985 | European Pat. Off. . |
| 0304127 | 2/1989 | European Pat. Off. . |
| 0364091 | 4/1990 | European Pat. Off. . |
| 3323153 | 1/1985 | Fed. Rep. of Germany . |
| 3406052 | 8/1985 | Fed. Rep. of Germany . |
| 4017260 | 12/1990 | Fed. Rep. of Germany . |
| WO86/07459 | 12/1986 | PCT Int'l Appl. . |
| WO91/19209 | 12/1991 | PCT Int'l Appl. . |

OTHER PUBLICATIONS

"NMR Imaging Techniques and Applications: A Review," Bottomley, Rev. Sci. Instrum. 53(9) Sep. 1982, pp. 1319–1377.
"Epoxidharze." Jahn 1969, pp. 218–226.
"Toughening of Anhydride Cured Epoxy Resins," Hussain et al., MIT Research Report R80 (1980).
"Rubber–Modified Epoxies. II Morphology and Mechanical Properties," Manzione et al. J. App. Polym. Sci. vol. 26 (1981) pp. 907–919.
"Rubber–Modified Isocyanurate–Oxazolidone Resins," Numata et al., Polym. J. vol. 14, No. 8 (1982) pp. 671–673.

*Primary Examiner*—Michael J. Tokar
*Attorney, Agent, or Firm*—Hill, Steadman & Simpson

[57] ABSTRACT

The supply of current pulses to gradient coils in a magnetic resonance imaging tomography apparatus results in physical vibration of the coils, causing acoustic noise. For reducing such acoustic noise, a gradient coil system is disclosed wherein the individual gradient coils are secured on a tubular carrier formed by a two concentric shells. The two shells are joined to each other in a manner which is rigid against shearing in the longitudinal direction by connector elements. The self-excited vibrational behavior of the gradient coil system is thereby tuned to lower vibrational amplitudes and to higher vibrational frequencies, so that a more effective damping can be achieved with acoustic damping measures.

17 Claims, 3 Drawing Sheets

GRADIENT COIL SYSTEM FOR A NUCLEAR MAGNETIC RESONANCE TOMOGRAPHY APPARATUS WHICH REDUCES ACOUSTIC NOISE

BACKGROUND OF THE INVENTION

1. Field of the Invention

The present invention is directed to a gradient coil system for a nuclear magnetic resonance tomography apparatus of the type wherein individual gradient coils are secured to a tubular carrier which surrounds an examination volume.

2. Description of the Prior Art

European Application 0 073 402 discloses a gradient coil system of the type described above. The gradient coils for the x, y and z directions are mounted on a tubular carrier with the gradient coils for the x-direction and for the y-direction being saddle coils.

Pulsed currents having an order of magnitude of 100–200 A and a switching time of less than 1 ms flow in the gradient coils. The mechanical forces resulting from the interaction of the conductors with the magnetic fields excite the gradient coil system and cause the system to vibrate as a unit. This results in a knocking noise which can be discomforting for the patient. The noise generation cannot be reduced to a satisfactory degree with conventional damping measures alone. Attempts have therefore been undertaken to reduce the creation of the noise by winding the coil system on a self-supporting basket-like (woven) arrangement. The sound emission surface and thus the noise generation are thus reduced. Examples of such designs are disclosed, for example, in European Application 0 304 127 and in German OS 34 06 052. The level of acoustical pressure, however, cannot be reduced to a satisfactory degree even with these designs.

Placement of the gradient coils in the vacuum of the cryostat is disclosed in European Application 0 123 075. Another proposal is to separate the examination space from the gradient coils using an evacuated double carrier. Such designs, however, would require high material and construction outlay, and moreover cannot prevent the transmission of acoustical vibrations through the structure itself.

Another proposal is disclosed in German OS 40 17 260 wherein the windings of the gradient coil are cast in an epoxy resin and are combined to form a coil system. This arrangement, however, still does not satisfactorily diminish the generation of noise, because noise having substantial low-frequency components is difficult to muffle.

SUMMARY OF THE INVENTION

It is an object of the present invention to provide a gradient coil system for a magnetic resonance imaging apparatus wherein the level of acoustic pressure caused by operation of the gradient coils is reduced in the examination space with minimum material and structural outlay.

The object is achieved in accordance with the principles of the present invention in a gradient coil system having a tubular carrier for the gradient coils formed by two concentric shells which are joined to each other by connector elements in a manner which is rigid against shearing in a longitudinal direction of the carrier, and wherein a sound-absorbing material is disposed between an interior cladding surrounding the examination space and the tubular carrier. The frequency of the whole-body bending mode is increased due to the stiff structure. Although the tubular carrier disclosed herein will emit sound, in contrast, for example, to the self-supporting cage arrangement described above, the level of acoustic pressure in the examination space is nonetheless comparatively reduced. The self-excited vibrational behavior is tuned to higher frequencies by elevating the frequency of the whole-body bending mode of the gradient coil. Although human hearing sensitivity increases at higher frequencies, the damping effect of sound-absorbent material also increases at such higher frequencies. The overall result is that the physiologically interpretable level of acoustic pressure is reduced. The gradient coil system and the material lining the interior are matched to each other in terms of frequency, so that an optimum reduction of the level of acoustic pressure is achieved.

DESCRIPTION OF THE PREFERRED EMBODIMENTS

As is known, a topical (spatial) resolution of nuclear magnetic resonance signals in a tomography apparatus is achieved by superimposing a magnetic field gradient on a uniform, static basic magnetic field on the order of magnitude of one Tesla. The principles of imaging are set forth, for example, in the article "NMR-Imaging Techniques and Applications: A Review," Bottomly, Review of Scientific Instrumentation, 53(9), 9/1982, pages 1319 through 1337.

Figure 1:
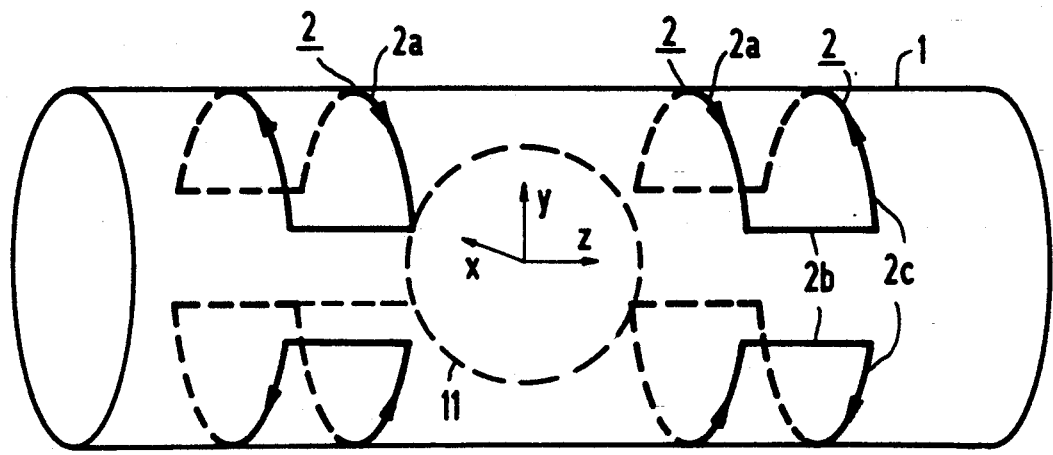
FIG. 1 is a schematic illustration of a conventional gradient coil for the y-direction for use in a magnetic resonance imaging apparatus.

For a topical resolution in three dimensions, magnetic field gradients must be produced in three directions which are preferably perpendicularly relative to each other. A Cartesian coordinate system showing the x,y,z directions is therefore shown in FIGS. 1 and 2. A conventional arrangement of gradient coils for generating a magnetic field gradient $G_y$ in the y-direction is schematically shown in FIG. 1. The gradient coils 2 are in the form of saddle coils which are mounted on a tubular carrier 1. As a result of the conductor sections $2a$, a substantially constant magnetic field gradient $G_y$ in the y-direction is generated within a spherical examination volume 11. The return conductors produce substantially negligible field components, due to their larger distance from the examination volume 11.

Gradient coils for generating a magnetic field gradient in the x-direction ($G_x$) are constructed identically to the gradient coils 2 for the magnetic field gradient in the y-direction, but rotated by 90° in the azimuthal direction on the tubular carrier 1. For clarity, these coils are not shown in FIG. 1, however, their structure is well-known to those skilled in the art.

Figure 2:
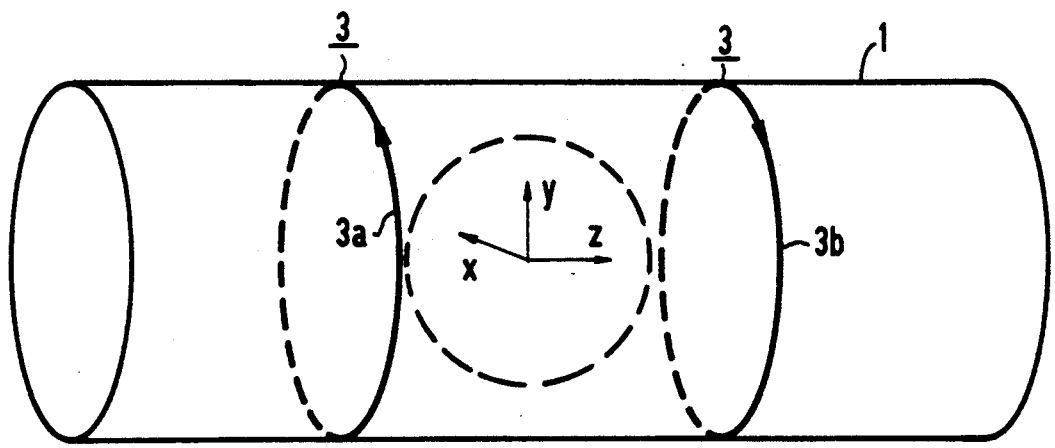
FIG. 2 is a schematic illustration of a conventional gradient coil for the z-direction for use in a magnetic resonance imaging apparatus.

The gradient coils 3 for generating a magnetic field gradient in z-direction are schematically shown in FIG. 2. These coils are annular, and are arranged symmetrically relative to the center point of the examination volume 11. Because the two individual coils 3a and 3b have current flowing therein in opposite directions, as indicated by the arrows in FIG. 2, these coils result in a magnetic field gradient in the z-direction.

Further details regarding the arrangement of gradient coils in a magnetic resonance imaging apparatus can be found in the aforementioned European Application 0 073 402.

Figure 3:
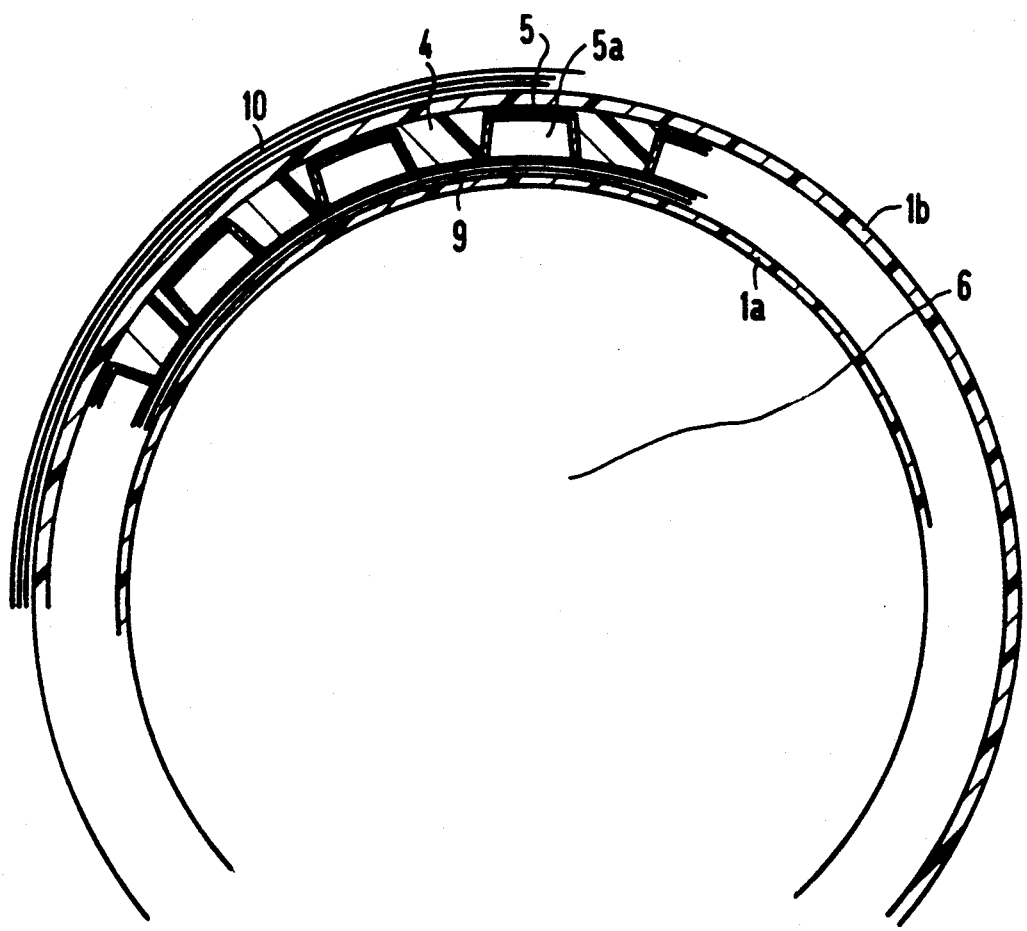
FIG. 3 is an end view of an exemplary embodiment of a gradient coil system constructed in accordance with the principles of the present invention.

An exemplary embodiment of a gradient coil system constructed in accordance with the principles of the present invention is shown in FIG. 3. In this embodiment, the tubular carrier 1 consists of an inner shell 1a and an outer shell 1b. The shells 1a and 1b are preferably manufactured of fiberglass-reinforced or carbon-fiber-reinforced plastic. The two shells 1a and 1b are connected to each other by connector elements 4 in a manner which is rigid against shearing the longitudinal direction of the carrier. The connector elements 4 are symmetrically distributed over the circumference of the tubular carrier, so that a particularly rigid mechanical structure is achieved.

The connector elements 4 extend in the axial direction of the gradient coil system, and consist of casting compound. To that end, a plurality of U-profiles 5, which are uniformly distributed over the circumference of the tubular carrier 1, are first placed between the shells 1a and 1b. The open side of each U-profile 5 faces toward the inner shell 1a. The height of the U-profiles 5 over the inner shell 1a is at least approximately the same as the spacing between the two shells 1a and 1b. Only a certain amount of play for aligning the two shells 1a and 1b relative to each other is present.

The interspaces between the two shells 1a and 1b remaining between the U-profiles are filled with a casting resin, which after curing constitutes the connector elements 4 in the form of cured casting resin material. The cured casting resin material must have a high modulus of elasticity in order to constribute to the rigidity of the gradient coil system. It is also preferable that the molded resin material have good sound damping characteristics at the operating temperature of the gradient coil system. Casting resins having an epoxy basis, particularly epoxy casting resins which are curable with acid anhydride, have suitable characteristics for this purpose. Due to their high degree of polymerization, acid-anhydride-cured molded epoxy resin materials containing fillers exhibit high strength values having moduli of elasticity ranging from approximately $10^4$ through $10^5$ N/mm$^2$ (See Janh, Epoxidharze, VEB Deutscher Verlag für Grundstoffindustrie, pages 218 ff). In addition, the composition thereof can be selected so that the demands of a sufficiently high modulus of elasticity and good sound damping are achieved at the operating temperature. The damping properties can be positively influenced by the use of suitable flexibilizer additives. Monomeric diole-based flexibilizers, such as 1,6-hexane diole or dioles having higher molecular weight such as polyoxy alkylene glycols are frequently employed. Preferred compounds of this type are polyoxy ethylene glycol and polyoxy alkylene glycol (as described in European Application 0 132 685). Dioles on the basis of polyurethane prepolymers can also be employed. Glycidyl ethers of these dioles are also suitable flexibilizers. Dependent on the structure and polymer chain length, the properties of cured epoxy resin material manufactured therewith can be influenced within broad limits.

The properties of the molded material can also be positively influenced in the context of use in a gradient coil systems by means of the filler. For example, the coefficient of expansion can be lowered by suitable filler selection and the resistance to thermal shocks is thus raised and the thermal conductivity is improved. For example, quartz powder, vitreous fused silica powder, aluminum oxide and wollastonite are suitable fillers for acid-anhydride-curable epoxy resins. Elastified casting resins are another good possibility for producing molded materials having high damping in addition to a high modulus of elasticity in defined temperature ranges. During curing, they form a molded material having two phases: a highly rigid epoxy phase and a highly damping resilient phase distributed therein in finely dispersed fashion. Examples are epoxy resins having functional polybutadieneoligomers (as described in MIT Research Report R80, Hussain, et al. (1980)) or having functional urethane prepolymers.

Filler-containing epoxy casting resins having aminic hardeners or epoxy/isocyanate resins, among others, are also suitable for the above-described use in addition to acid-anhydride-curable epoxy casting resins. In these materials as well, the damping properties can be increased in defined temperature ranges both in a uniform single phase and in elastified, two-phased molded resin materials without producing a pronounced decrease in the modulus of elasticity (as described by Manzione et al. in J. Appl. Polym. Sci. 26 (1981), pages 907–919 and Numata et al., Polymer J. 14 (8), (1982) pages 671–673 and German OS 33 23 153). Polyurethane casting resins are also suitable for casting the gradient coil systems.

For example, a casting resin composed of an epoxy resin on the basis of bisphenol A-diglycidylether (epoxy value 0.51 mol/100 g), an isomer mixture of methyltetrahydrophthalic acid anhydride as a hardener and approximately 20% (with reference to the hardener) consisting of a flexibilizer mixture of polyoxy ethylene glycol and polyoxy propylene glycol (average molecular weight approximately 400) has proven suitable for casting gradient coil systems. The casting resin contains 66% quartz meal as filler and approximately 0.4% (with references to the resin matrix) of an ammonium phenolate as a hardening accelerator. The processing of such casting resins preferably ensues by vacuum casting. The casting resin is thereby carefully mixed at an elevated temperature and the coil system, which is similarly conditioned in a vacuum is then cast in the resin and is cured at an elevated temperature. This ensures that a homogeneous molded material which is free of voids is achieved and that even narrow gaps and undercuts are filled with casting resin.

The interiors of the U-profiles 5 can be maintained open as aeration channels. Because the sub-coils 9 of each of the gradient coils are arranged at the exterior of the inner shell 1a, good heat transmission to the aeration channels formed by the U-profiles 5 is assured.

Casting resin must be prevented from penetrating into the interiors of the U-profiles 5. To that end, the U-profiles 5 are first preferably glued to the inside shell 1a, already provided with the sub-coils 9 and are then sealed at the longitudinal edges.

Alternatively, the channels 5a formed by the U-profiles 5 can be cast with a curing casting resin which is optimized with respect to high noise damping, so that the modulus of elasticity is substantially out of consideration. In this case, the casting resin for the carrying elements 4 can then be optimized for having a high modulus of elasticity.

A further reduction in the level of acoustic pressure is achieved in an embodiment wherein the gradient coils are constructed of two sub-coils, wherein the first sub-coil 9 is arranged at the exterior of the inner shell 1a and the second sub-coil 10 is arranged at the exterior of the outer shell 1b. Both sub-coils 9 and 10 have the same current flowing therein, but in opposite directions. Given rigid coupling to the double-shelled tubular carrier, only the resultant forces of the sub-coils 9 and 10 act thereon. Both sub-coils 9 and 10 are optimized under the boundary condition that the whole-body bending modes of the two sub-systems are matched to each other, and the local bending forces are minimized. A rigid coupling of the two sub-systems (inner shell 1a, sub-coil 9 and outer shell 1b, sub-coil 10) is thereby important. Measurements have shown that additional reduction in the level of acoustic pressure of approximately 6 dB compared to a simple gradient coil.

Problem-free cooling of the outer sub-coil 10 is possible by maintaining an aeration channel to the surrounding structure open.

The resultant magnetic fields substantially cancel toward the exterior due to the oppositely directed currents in the two sub-coils. A reduction of the currents in the conductive structure surrounding the gradient coil system is thus obtained as a beneficial side effect. The resultant gradient field is also attenuated in the examination space, which must be compensated with a higher current density.

Figure 4:
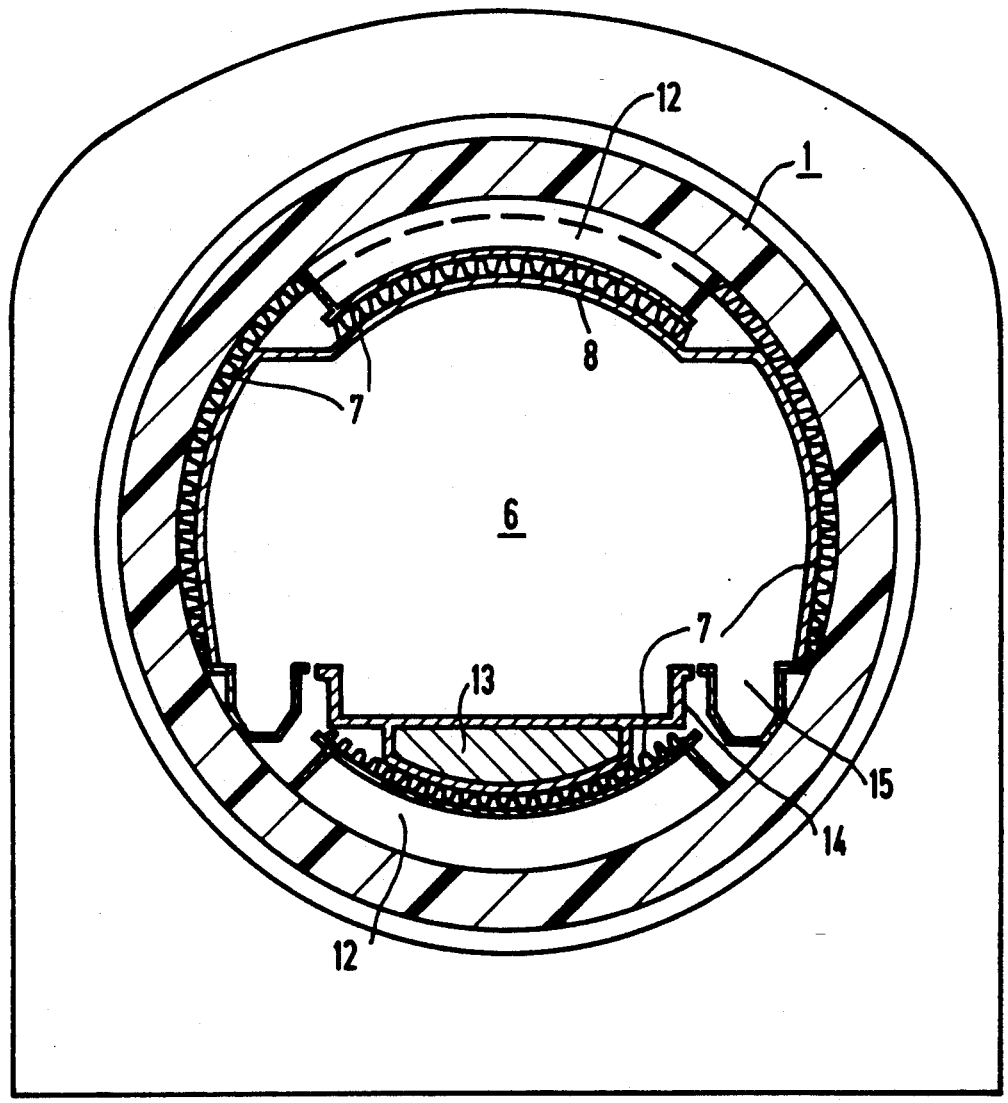
FIG. 4 is an end view showing the arrangement of a gradient coil system with sound-damping material constructed in accordance with the principles of the present invention in a magnetic resonance imaging tomography apparatus.

The level of acoustic pressure in the examining space can be further reduced with a sound-muffling cladding. This is schematically shown in FIG. 4. The two-shell tubular carrier described above is again referenced 1. For clarity, the gradient coils have been omitted. A resonator system 12 is provided for subjecting a patient to high-frequency pulses and for receiving the resulting nuclear magnetic resonant signals. A patient to be examined is introduced into the examination space 6 lying on a patient support 14, by means of a support guide 13. The support guide 13 together with the support 14 are designed so that rigid contact with the inner structure of the magnetic resonance apparatus does not occur at any point, so that no structure-borne sound transmission can arise.

Cable rails 15 which accept the connecting cables for the connection of the apparatus to the patient or at the bed 14, for example, for ECG measurements or for surface coils, are provided at both sides of the bed 14.

The entire examination space is provided with an inside cladding 8. Sound-absorbent mats consisting of, for example, rock wool are provided between the inside cladding 8 and the structure of the magnetic resonance apparatus, or between the bed 14 and the structure of the magnetic resonance apparatus. The level of acoustic pressure is thereby additionally reduced. A particular advantage is that the effectiveness of the sound-damping measures with respect to low frequencies is noticeably enhanced due to the increase in the frequency of the whole-body bending mode on the basis of the above-described structure of the tubular carrier 1.

The inside cladding 8 should not have a rigid connection to the structure of the nuclear magnetic resonance tomography apparatus at any location, in order to avoid transmission of structure-borne sound.

The level of acoustic pressure achieved with the disclosed design was measured for various embodiments. The measured conditions were as follows:

| Basic Field Strength | 1 Tesla |
|---|---|
| Current | 100 A, rise and decay time each 1 ms |
| Pulse Rate | 12 ms current, 36 ms pause |
| Measuring Location | Middle magnet axis, radius 100 mm (aural cylinder) |

A two-shell gradient coil having a modulus of elasticity of 200,000N/mm$^2$ was employed. The outer shell was 10 mm thick. The following levels of acoustic pressure were achieved for various embodiments:

| | |
|---|---|
| Gradient coil without additional measures | 93 db (A) |
| Interspace of the shell having a casting resin applied in vacuum casting, at room temperature | 85 db (A) |
| As above, but at operating temperature | 81 db (A) |
| An additional 20 mm of rock wool and self-supporting interior cladding | 72 dB (A) |

Compared to conventional systems, a considerable reduction in the level of acoustic pressure was achieved, thereby enhancing the comfort of the patient during the examination.

Although modifications and changes may be suggested by those skilled in the art, it is the intention of the inventors to embody within the patent warranted hereon all changes and modifications as reasonably and properly come within the scope of their

We claim as our invention:

1. In a gradient coil system for a magnetic resonance imaging apparatus including a plurality of gradient coils surrounding an examination volume, the improvement comprising:

a tubular carrier for said gradient coils formed by two concentric, radially-spaced tubular shells;

a plurality of spaced connector elements disposed between said shells which join said shells in a manner which is rigid against shearing in a longitudinal direction of said shells;

an interior cladding surrounding said examination volume inside said tubular carrier; and sound-absorbent material disposed between said inside cladding and said tubular carrier.

2. The improvement of claim 1 wherein said inside cladding has no rigid coupling to said tubular carrier.

3. The improvement of claim 1 wherein said connector elements each consist of cured, shaped resin material having a high modulus of elasticity.

4. The improvement of claim 3 further comprising a plurality of profiles each having an open side, said profiles being uniformly circumferentially distributed between said two shells with the respective open sides of said profiles pressing against one of said two shells, said profiles forming a plurality of channels which are free of said resin material.

5. The improvement of claim 4 wherein said channels formed by said profiles are maintained open as aeration channels.

6. The improvement of claim 4 wherein said channels are filled with further, thermally curable casting resin forming a molded material after curing having a high acoustic damping.

7. The improvement of claim 3 wherein said connector elements consist of a molded material having a high modulus of elasticity and having high acoustic damping at an operating temperature of said magnetic resonance tomography apparatus.

8. The improvement of claim 6 wherein at least of said molded material and said further molded material consists of an epoxy casting resin containing a filler.

9. The improvement of claim 6 wherein at least one of said molded material and said further molded material consists of a flexibilized epoxy casting resin containing a filler.

10. The improvement of claim 6 wherein at least one of said molded material and said further molded material consists of a flexibilized, acid-anhydride-curable epoxy casting resin containing a filler.

11. The improvement of claim 3 wherein said resin material is cast in a vacuum.

12. The improvement of claim 6 wherein said further resin material is cast in a vacuum.

13. The improvement of claim 4 wherein said two shells consist of an inner shell and an outer shell, wherein said gradient coils are secured to an outer surface of said inner shell, and wherein said open ends of said profiles are disposed in a direction toward said gradient coils.

14. The improvement of claim 1 wherein each gradient coil consists of two sub-coils, wherein said two shells consist of an inner shell and an outer shell and wherein said two sub-coils for each gradient coils are respectively attached to said inner and outer shells, each sub-coil for a gradient coil being supplied with current flowing in respectively opposite directions so that said sub-coils for a gradient coil respectively generate opposing magnetic fields.

15. The improvement of claim 13 wherein each of said sub-coils has a whole-body bending mode, and wherein the whole-body bending modes of the sub-coils of a gradient coil are matched.

16. The improvement of claim 14 wherein the two sub-coils for a gradient coil are respectively attached to the exterior of said inner and outer shells.

17. In a gradient coil system for a magnetic resonance imaging apparatus including a plurality of gradient coils surrounding an examination volume, the improvement comprising:
- a tubular carrier for said gradient coils formed by two concentric, radially-spaced tubular shells;
- a plurality of spaced connector elements disposed between said shells which join said shells in a manner which is rigid against shearing in a longitudinal direction of said shells;
- an interior cladding surrounding said examination volume inside said tubular carrier;
- sound-absorbent material disposed between said inside cladding and said tubular carrier; and
- said connector elements consisting of a first cured, shaped resin material having a high modulus of elasticity and a second cured, shaped resin material, mixed with said first resin material, having high acoustic damping.

* * * * *